(12) United States Patent
Cai et al.

(10) Patent No.: US 10,756,147 B2
(45) Date of Patent: Aug. 25, 2020

(54) ORGANIC LIGHT-EMITTING DISPLAY PANEL WITH IMPROVED RESOLUTION AND ELECTRONIC DEVICE

(71) Applicant: Shanghai Tianma Micro-Electronics Co. Ltd., Shanghai (CN)

(72) Inventors: Xiaobo Cai, Shanghai (CN); Sitao Huo, Shanghai (CN); Wenxin Jiang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/985,633

(22) Filed: May 21, 2018

(65) Prior Publication Data

US 2018/0269268 A1    Sep. 20, 2018

(30) Foreign Application Priority Data

Nov. 30, 2017    (CN) .......................... 2017 1 1243705

(51) Int. Cl.
| | |
|---|---|
| *H01L 27/32* | (2006.01) |
| *H01L 51/52* | (2006.01) |
| *G09G 3/3208* | (2016.01) |

(52) U.S. Cl.
CPC ....... *H01L 27/3246* (2013.01); *G09G 3/3208* (2013.01); *H01L 27/3211* (2013.01);
(Continued)

(58) Field of Classification Search
CPC .......... G09G 3/30; G09G 3/32; G09G 3/3208; G09G 3/3216; G09G 3/3225; G09G 3/3233; G09G 3/3241; G09G 3/325
(Continued)

(56) References Cited

U.S. PATENT DOCUMENTS

| | | | | |
|---|---|---|---|---|
| 6,187,657 | B1 * | 2/2001 | Xiang ............... | H01L 21/28105 257/E21.196 |
| 2002/0125832 | A1 * | 9/2002 | Yokoyama .......... | G09G 3/3225 315/169.3 |

(Continued)

FOREIGN PATENT DOCUMENTS

| | | |
|---|---|---|
| CN | 101739933 A | 6/2010 |
| CN | 103811533 A | 5/2014 |

(Continued)

*Primary Examiner* — Alexander Eisen
*Assistant Examiner* — Nelson Lam
(74) *Attorney, Agent, or Firm* — Alston & Bird LLP

(57) ABSTRACT

Provided are an organic light-emitting display panel and an electronic device. The organic light-emitting display panel includes a plurality of sub-pixel units and a plurality of pixel circuits. The sub-pixel units are defined by a bank, the plurality of sub-pixel units emits m different colors, any two adjacent sub-pixel units emit different colors, each of the plurality of sub-pixel units includes n sub-pixels emitting a same color, and each of the sub-pixels includes a first electrode, the first electrodes of any two sub-pixels are separated from each other, where m is 3 or 4, and n is an integer no less than 3. The pixel circuits are arranged in a rectangular array, the pixel circuits are in one-to-one correspondence with the sub-pixels, and each of the pixel circuits is electrically connected to the corresponding first electrode via a connecting wire.

17 Claims, 11 Drawing Sheets

(52) U.S. Cl.
CPC ...... *H01L 27/3218* (2013.01); *H01L 27/3248* (2013.01); *H01L 27/3262* (2013.01); *H01L 51/5203* (2013.01); *G09G 2300/0426* (2013.01); *G09G 2300/0452* (2013.01); *G09G 2300/0465* (2013.01); *H01L 27/3276* (2013.01); *H01L 27/3288* (2013.01)

(58) Field of Classification Search
USPC .................................. 345/76–83; 315/169.3
See application file for complete search history.

(56) References Cited

U.S. PATENT DOCUMENTS

| | | | | |
|---|---|---|---|---|
| 2006/0221092 | A1* | 10/2006 | Noguchi | H05B 33/02 345/589 |
| 2011/0025723 | A1* | 2/2011 | Kim | H01L 27/3218 345/690 |
| 2011/0316431 | A1* | 12/2011 | Kawasaki | G09G 3/2003 315/169.3 |
| 2014/0043217 | A1* | 2/2014 | Kim | G09G 3/3233 345/76 |
| 2014/0054624 | A1* | 2/2014 | Chen | H01L 27/156 257/89 |
| 2014/0292622 | A1* | 10/2014 | Lee | G09G 3/3233 345/80 |
| 2015/0077447 | A1* | 3/2015 | Zhang | G02F 1/167 345/694 |
| 2015/0170578 | A1* | 6/2015 | Choi | G09G 3/3266 345/212 |
| 2016/0013252 | A1* | 1/2016 | Wang | H01L 27/3213 345/206 |
| 2017/0132969 | A1* | 5/2017 | Guo | G09G 3/2003 |

FOREIGN PATENT DOCUMENTS

| | | |
|---|---|---|
| CN | 104600200 A | 5/2015 |
| CN | 104854651 A | 8/2015 |
| CN | 105720074 A | 6/2016 |
| CN | 107359176 A | 11/2017 |

* cited by examiner

ORGANIC LIGHT-EMITTING DISPLAY PANEL WITH IMPROVED RESOLUTION AND ELECTRONIC DEVICE

CROSS-REFERENCE TO RELATED APPLICATIONS

This application claims priority to a Chinese patent application No. CN201711243705.6 filed on Nov. 30, 2017, the disclosure of which is incorporated herein by reference in its entirety.

TECHNICAL FIELD

The present disclosure relates to display technologies, in particular to an organic light-emitting display panel and an electronic device.

BACKGROUND

With fast development of portable electronic terminal devices, such as mobile phones and tablet computers, the functions of these electronic terminal devices have become more powerful. In order to load functions such as display of a film, video call, mobile game etc., the electronic terminal devices are required to have excellent visual effects. Therefore, at present, the main developing trend of display panel is to improve the resolution of the display panel of the electronic terminal devices.

The majority of the electronic terminal devices take use of existing organic light-emitting display panels. From a structural point of view, a bank is used for defining sub-pixel units on a plane substrate, and various layers of organic light-emitting display materials are formed as respective films in the area formed by the bank. The problem of the existing organic light-emitting display panel to be solved is to improve the resolution of organic light-emitting display panel.

SUMMARY

The present disclosure provides an organic light-emitting display panel and an electronic device, so as to improve the resolution of the organic light-emitting display panel.

In an aspect, one or more embodiments of the present disclosure provide an organic light-emitting display panel, which includes:

sub-pixel units, which are defined by a bank, the plurality of sub-pixel units have m different colors, any two adjacent sub-pixel units of the plurality of sub-pixel units have different colors, each of the plurality of sub-pixel units includes n sub-pixels of a same color, each of the sub-pixels includes a first electrode, first electrodes of any two of the sub-pixels are separated from each other, where m is 3 or 4, and n is an integer no less than 3; and pixel circuits, which are arranged in a rectangular array, the pixel circuits are in an one-to-one correspondence with the sub-pixels, and each pixel circuit of the pixel circuits is electrically connected to the first electrode corresponding to the each pixel circuit via a connecting wire.

In another aspect, one or more embodiments of the present disclosure provide an electronic device, which includes the organic light-emitting display panel described above.

BRIEF DESCRIPTION OF DRAWINGS

In order to make a clear description for the technical solutions in the present disclosure, a simple description about the drawings employed in embodiments of the present disclosure is given as below. Apparently, the drawings stated herein are some embodiments of the present disclosure, and other drawings may be achieved on the basis of the drawings here by those skilled in the art without creative works.

DETAILED DESCRIPTION

In order to make objects, technical solutions and advantages of the present disclosure more clear, the technical solutions of the present disclosure are clearly and fully described below in combination with the drawings and embodiments. Apparently, the drawings stated herein are some embodiments of the present disclosure instead of all the embodiments. Based on the embodiments of the present disclosure, other embodiments obtained by those skilled in the art without creative works may fall into a scope of protection.

Figure 1:
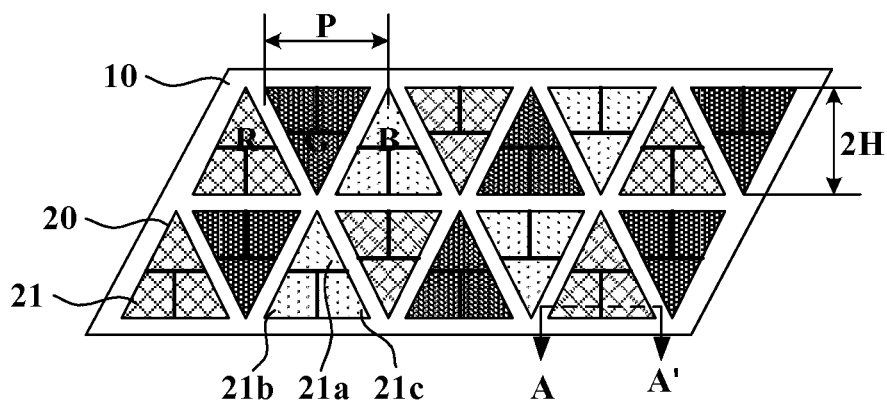
FIG. 1 is a diagram showing an organic light-emitting display panel according to an embodiment of the present disclosure.
Figure 2:
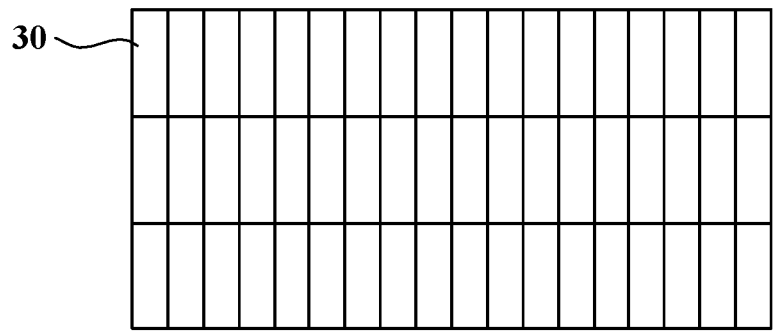
FIG. 2 is a diagram showing an arrangement of a pixel circuit array of the organic light-emitting display panel like the one in FIG. 1.
Figure 3:
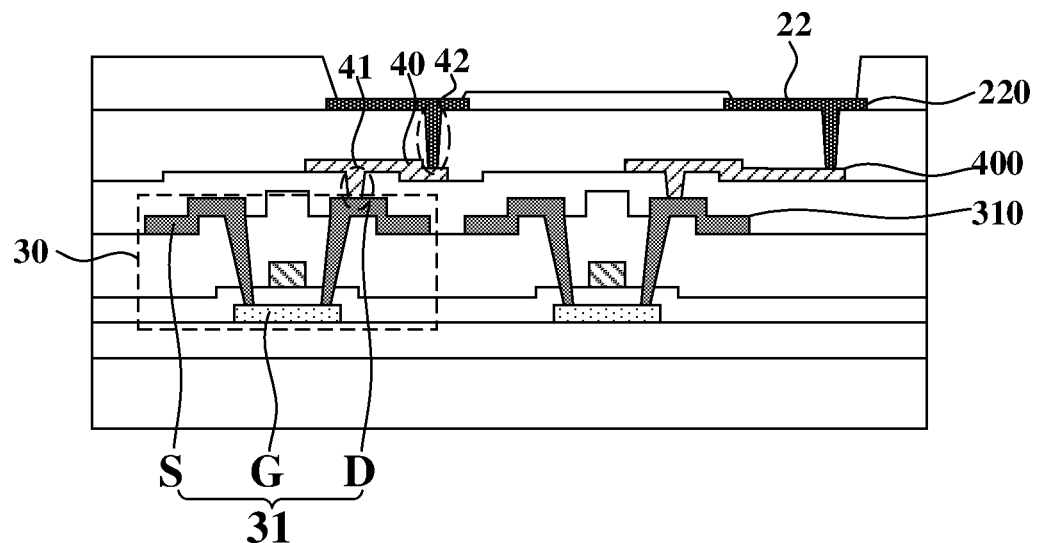
FIG. 3 is a cross sectional view of an exemplary structure of the organic light-emitting display panel of FIG. 1 along A-A'.
Figure 4:
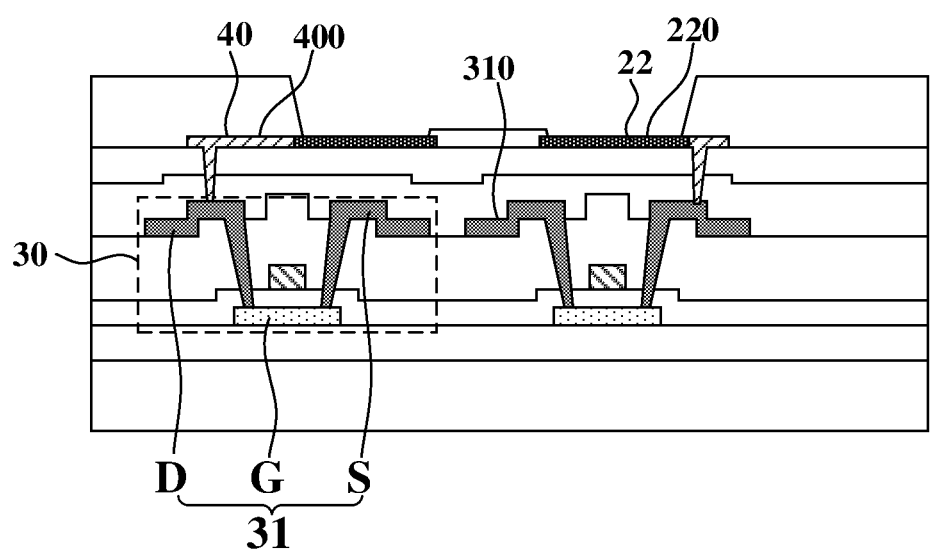
FIG. 4 is a cross sectional view of another exemplary structure of the organic light-emitting display panel of FIG. 1 along A-A'.

FIG. 1 is a diagram showing an organic light-emitting display panel according to an embodiment of the present disclosure. The organic light-emitting display panel provided by this embodiment of the present disclosure includes sub-pixel units 20 and pixel circuits 30. As shown in FIGS. 1 and 3, the sub-pixel units 20 are defined by a bank 10, the sub-pixel units 20 emit m different colors, any two adjacent sub-pixel units 20 emit different colors, each of the plurality of sub-pixel units 20 includes n sub-pixels 21 emitting the same color, the sub-pixel includes a first electrode 22, the first electrodes 22 of any two sub-pixels 21 are separated from each other, m is 3 or 4, and n is an integer no less than 3. The pixel circuits 30 are arranged in a rectangular array, the pixel circuits 30 are in one-to-one correspondence with the sub-pixels 21, and each pixel circuit 30 is electrically connected to the first electrode 22 of the sub-pixel 21 corresponding to the pixel circuit 30 via a connecting wire 40. FIG. 1 is a diagram showing an arrangement of part of sub-pixel units of an organic light-emitting display panel. FIG. 2 is a diagram showing an arrangement of part of a pixel circuit array of the organic light-emitting display panel shown in FIG. 1. FIG. 3 is a cross sectional view of an exemplary structure of the organic light-emitting display panel of FIG. 1 along A-A', and FIG. 4 is a cross sectional view of another exemplary structure of the organic light-emitting display panel of FIG. 1 along A-A'.

In this embodiment, sub-pixel units 20 are defined by the bank 10, the sub-pixel units 20 emit m different colors, where m may be 3. For example, the sub-pixel units 20 consist of one or more red sub-pixel units R, one or more green sub-pixel units G and one or more blue sub-pixel units B. In other embodiments, m may be 4. For example, the sub-pixel units include one or more red sub-pixel units, one or more green sub-pixel units, one or more blue sub-pixel units and one or more white sub-pixel units; or the sub-pixel units include one or more red sub-pixel units, one or more green sub-pixel units, one or more blue sub-pixel units and one or more yellow sub-pixel units.

In this embodiment, any two adjacent sub-pixel units 20 emit different colors. That is, any two adjacent sub-pixel units 20 in a same row emit different colors, and any two adjacent sub-pixel units 20 in a same column emit different colors. Each sub-pixel unit 20 includes n sub-pixels 21 emitting the same color, and the sub-pixel 21 includes a first electrode 22. The first electrodes 22 of any two sub-pixels 21 are separated from each other. The sub-pixels 21 of the sub-pixel unit 20 are arranged in a non-rectangular array. Among them, n sub-pixels 21 of each sub-pixel unit 20 keep independent from each other, and whether each sub-pixel 21 emits light is controlled by the organic light-emitting display panel independently. Therefore, the switch between different resolutions may be controlled. For example, each sub-pixel 21 of each sub-pixel unit 20 is controlled to participate in the display to achieve a high resolution. For example, a part of sub-pixels 21 of each sub-pixel unit 20 is controlled to participate in the display to achieve a low resolution.

Figure 5:
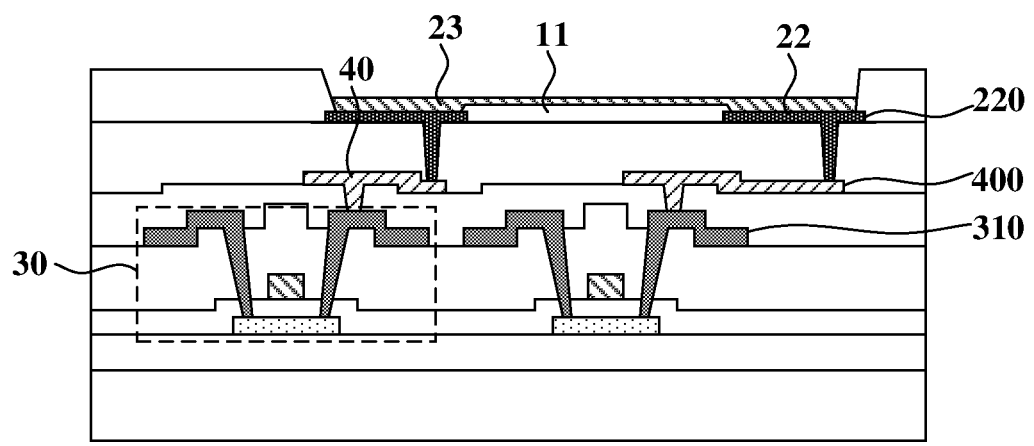
FIG. 5 is a cross sectional view of an organic light-emitting display panel.

In this embodiment, a sub-pixel unit 20 includes sub-pixels 21 emitting the same color. As shown in FIGS. 1 and 5, sub-pixels 21 in one sub-pixel unit 20 may share one organic light-emitting layer 23. In contrast with the related art, evaporating or ink-jet printing the organic light-emitting layer 23 will not increase the technology difficulty or the number of manufacture processes. In this embodiment, multiple first electrodes 22, which are independent from each other, are arranged in a sub-pixel unit 20; a sub-pixel unit 20 can include multiple sub-pixels 21. In contrast with the related art, the resolution can be significantly improved without increasing the technology difficulty or the number of manufacturing processes. It should be noted that, the first electrodes 22, which are independent from each other, of the sub-pixel unit 20 are separated by means of an organic bank or support pillar 11 (e.g., PS pillar).

In this embodiment, the organic light-emitting display panel also includes multiple pixel circuits 30 arranged in a rectangular array. The pixel circuits 30 are in one-to-one correspondence with the sub-pixels 21. Each of the pixel circuits 30 is configured to independently control a respective one of the sub-pixels 21 to emit light or not to emit light. Therefore, the organic light-emitting display panel may control each sub-pixel 21 of a sub-pixel unit 20 to participate in the display by means of the pixel circuits 30 to achieve a high resolution; and the organic light-emitting display panel may also control at least one sub-pixel 21 of a sub-pixel unit 20 to participate in the display by means of the pixel circuit 30 to control the switch between different resolutions. As shown in FIG. 2, the pixel circuits 30 are arranged in a rectangular array. However, the sub-pixels 21 of sub-pixel units 20 are arranged in a non-rectangular array, and the pixel circuits 30 are in one-to-one correspondence with the sub-pixels 21. Therefore, a pixel circuit 30 is electrically connected to the first electrode 22 of a sub-pixel 21 corresponding to the pixel circuit 30 via the connecting wire 40. In view of the above, no matter which arrangement in which the sub-pixel units 20 and the sub-pixels 21 of the sub-pixel units 20 of the organic light-emitting display panel are arranged, the pixel circuit 30 may be electrically connected to the first electrode 22 of the sub-pixel 21 corresponding to the pixel circuit 30 via the connecting wire 40. The arrangement of the pixel circuits 30 and the manner in which the pixel circuits 30 and the sub-pixels 21 are connected provided by the present embodiment may be applied to any arrangement of the sub-pixels 21.

It should be noted that, since the pixel circuits 30 are arranged in a rectangular array in this embodiment, the scanning lines and the data lines of the organic light-emitting display panel may be arranged in a common manner of rows and columns, and the complexity of layout of the scanning lines and the data lines will not increase.

In one embodiment, the pixel circuit 30 shown in FIG. 3 includes a light-emitting control transistor 31. The light-emitting control transistor 31 includes a source electrode S, a drain electrode D and a gate electrode G. The drain electrode D of the light-emitting control transistor 31 is electrically connected to the first electrode 22 of the sub-pixel 21 corresponding to the light-emitting control transistor 31 via the connecting wire 40. A film layer 400 in which the connecting wire 40 is located is disposed between a film layer 220 in which the first electrode 22 is located and a film layer 310 in which the drain electrode D of the light-emitting control transistor 31 is located.

Here, an extra inducting layer is provided and is etched to form a connecting wire 40 which electrically connects the first electrode 22 to the pixel circuit 30. The film layer in which the connecting wire 40 is located is disposed between the film layer in which the first electrode 22 is located and the film layer in which the drain electrode D of the light-emitting control transistor 31 is located. Based on the above, the connecting wire enables the pixel circuits 30 arranged in a rectangular array to control the sub-pixels 21 arranged in a non-rectangular array without increasing the complexity of wire layout. In one embodiment, the connecting wire 40 may be electrically connected to the drain electrode D of the light-emitting control transistor 31 of the pixel circuit 30 corresponding to the connecting wire 40 through a first via 41, and the first electrode 22 is electrically connected to the connecting wire 40 corresponding to the first electrode 22 through a second via 42. Therefore, the first via 41 and the second via 42 are arranged with a same period as the first electrode 22, which facilitates the manufacture and the complexity of process will not increase.

In one embodiment, as shown in FIG. 3, a projection of the connecting wire 40 in a direction perpendicular to the organic light-emitting display panel does not overlap with the first electrode 22 not corresponding to the connecting wire 40. That is, the projection of the connecting wire 40 in the direction perpendicular to the organic light-emitting display panel partially overlaps the first electrode 22 corresponding to the connecting wire 40, and the aperture ratio of the sub-pixel 21 is not seriously affected. Thus, the wire layout of the connecting wire 40 may be applied to a top-emitting organic light-emitting display panel, and may also be applied to a bottom-emitting organic light-emitting display panel with pixel circuits 30 of a specific aperture ratio.

In one embodiment, the pixel circuit 30 shown in FIG. 4 includes a light-emitting control transistor 31. The light-emitting control transistor 31 includes a source electrode S, a drain electrode D and a gate electrode G. The drain electrode D of the light-emitting control transistor 31 is electrically connected to the first electrode 22 of the sub-pixel 21 corresponding to the light-emitting control transistor 31 via a connecting wire 40. The connecting wire 40 and the first electrode 22 are disposed in a same layer.

Here, the connecting wire 40 and the first electrode 22 are disposed in a same layer instead of using an extra layer of connecting wire. That is, when a film layer of the first electrode 22 is formed, the connecting wire 40 and the first electrode 22 may be formed at the same time by etching, and the connecting wire 40 is electrically connected to the corresponding first electrode 22. Based on the above, the connecting wire enables the pixel circuits 30 arranged in a rectangular array to control the sub-pixels 21 arranged in a non-rectangular array without increasing the complexity of wire layout. In one embodiment, the connecting wire 40 is disposed in the area covered by the bank and is electrically connected to the drain electrode D of the light-emitting control transistor 31 of the pixel circuit 30 corresponding to the connecting wire 40. The connecting wire 40 is configured to be bended to avoid the unrelated adjacent via and first electrode 22, and then the connecting wire 40 is electrically connected to the via and the first electrode 22 corresponding to the pixel circuit 30. The connecting wire 40 is electrically connected to the first electrode 22 and does not overlap with the first electrode 22 at all, and the aperture ratio of the sub-pixel 21 is not seriously affected. Furthermore, the connecting wire 40 is electrically connected to the pixel circuit 30 and is disposed in the non-aperture area covered by the bank 10. Thus, the wire layout of the connecting wire 40 may be applied to not only the top-emitting organic light-emitting display panel but also the bottom-emitting organic light-emitting display panel with pixel circuits 30 of a specific aperture ratio.

In one embodiment, as shown in FIG. 4, a projection of the connecting wire 40 in a direction perpendicular to the organic light-emitting display panel does not overlap with the first electrode 22 not corresponding to the connecting wire 40. The pixel circuits 30 are arranged in a rectangular array, while the sub-pixels 21 are arranged in a non-rectangular array. The pixel circuits 30 arranged in the rectangular array may control the sub-pixels 21 arranged in the non-rectangular array. When the connecting wire 40 and the first electrode 22 are arranged in a same layer, the first electrode 22 may not be adjacent with the connecting wire 40 corresponding to the first electrode 22. Then, the connecting wire 40 needs to be bended to avoid unrelated adjacent via and first electrode 22 and to be electrically connected to the via and the first electrode 22 corresponding to the pixel circuit 30. Therefore, the projection of the connecting wire 40 in the direction perpendicular to the organic light-emitting display panel does not overlap with the first electrode 22 corresponding to the connecting wire 40, so that the connecting wire 40 is not short with the corresponding first electrode 22.

In this embodiment, first electrodes 22, which are independent from each other, are provided in the sub-pixel unit, thus a sub-pixel unit may include multiple sub-pixels 21. In contrast with the related art, the resolution is improved significantly without increasing the technology difficulty and the number of manufacture processes. In this embodiment, since the pixel circuits are arranged in a rectangular array, the difficulty of the wire layout for the scanning lines and the data lines will not increase. The pixel circuits are in one-to-one correspondence with the sub-pixels. A pixel circuit is electrically connected to the first electrode of the sub-pixel corresponding to the pixel circuit via the connecting wire. In this way, the pixel circuits arranged in a rectangular array can control the sub-pixels arranged in a non-rectangular array.

In one embodiment, as shown in FIG. 1, the sub-pixel unit 20 has a shape of a triangle, and the sub-pixel unit 20 includes three sub-pixels 21. The sub-pixel unit 20 has a shape of a triangle, and any two adjacent sub-pixel units 20 are arranged in opposite directions. The sub-pixel units 20 in a same row may be disposed in following manner: a triangle, a reverse triangle, a triangle, a reverse triangle, etc. The sub-pixel units 20 in a same column may be disposed in following manner: a triangle, a reverse triangle, a triangle, a reverse triangle, etc. Therefore, the sub-pixel units 20 of the organic light-emitting display panel are arranged in a high-density manner with a small gap, so that more sub-pixel units can be disposed and a high resolution is achieved.

The organic light-emitting display panel shown in FIG. 1 may have several display modes. In display mode 1, each sub-pixel 21 of each sub-pixel unit 20 participates in the display, so that a high resolution is achieved and the visual experience is improved. In display mode 2, only one sub-pixel 21 in each sub-pixel unit 20 participates in the display, so that a low resolution is achieved and the power consumption is reduced. In display mode 3, at least one sub-pixel 21 of each sub-pixel unit 20 participates in the display, so that a resolution between said low resolution and said high resolution may be achieved. When the organic light-emitting display panel is applied in electronic devices, the organic light-emitting display panel can switch between the display modes according to the requirements for different visual effects.

Figure 6:
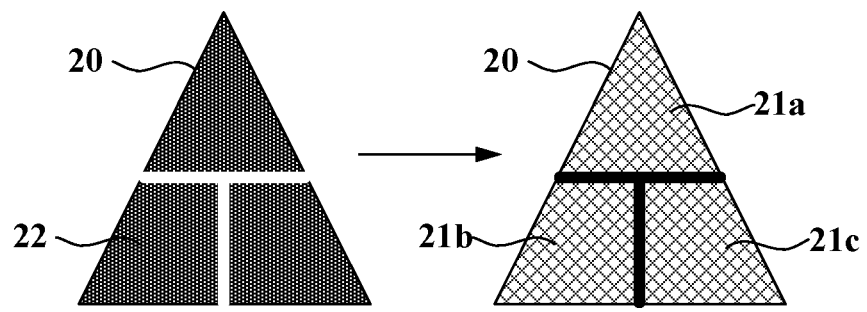
FIG. 6 is a diagram showing a couple of sub-pixel units of the organic light-emitting display panel according to an embodiment of the present disclosure.

In one embodiment, the sub-pixel unit 20 shown in FIG. 1 has a shape of an isosceles triangle, and the sub-pixel unit 20 may be divided into a first sub-pixel 21a, a second sub-pixel 21b and a third sub-pixel 21c according to a letter "T". The first electrodes of three sub-pixels 21 in each sub-pixel unit 20 are disposed according to the letter "T" and are insulated from each other. Then, an organic light-emitting layer is formed in the sub-pixel unit 20 by evaporating or ink-jet printing, which may form the three sub-pixels 21 divided according to the letter "T". As shown in FIG. 6, one sub-pixel unit 20 includes three first electrodes 22 divided according to the letter "T". In combination with FIG. 3 to FIG. 5, any two adjacent first electrodes 22 are separated by means of a bank or a support pillar (e.g., PS pillar).

As shown in FIG. 6, the shapes of the first electrodes of three sub-pixels 22 in each sub-pixel unit 20 may be chosen to include an isosceles triangle containing a vertex angle of the sub-pixel unit 20 and two right-angled trapezoids having a same shape containing a base angle of the sub-pixel unit. Then, an organic light-emitting layer is formed in the sub-pixel unit 20 by evaporating or ink-jet printing, which may form the three sub-pixels 21 divided according to the letter "T". The shape of the sub-pixel 21 relates to the shape of its corresponding first electrode 22. Accordingly, the shape of the first sub-pixel 21a may be an isosceles triangle containing a vertex angle of the sub-pixel unit 20, and the second sub-pixel 21b and the third sub-pixel 21c have the same shape of a right-angled trapezoid containing a base angle of the sub-pixel unit 20.

Figure 7:
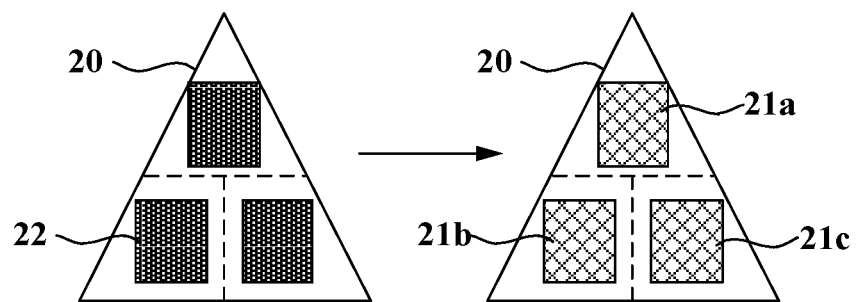
FIG. 7 is a diagram showing a couple of sub-pixel units of the organic light-emitting display panel according to an embodiment of the present disclosure.

In other embodiments, as shown in FIG. 7, each of three first electrodes 22 in the sub-pixel unit 20 may have a shape of a rectangle. Accordingly, the first sub-pixel 21a, the second sub-pixel 21b and the third sub-pixel 21c of the sub-pixel unit 20 may have the same shape of a rectangle.

Figure 8:
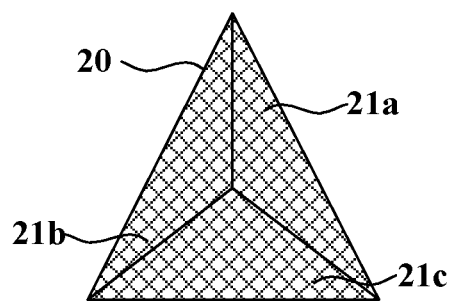
FIG. 8 is a diagram showing a sub-pixel unit of the organic light-emitting display panel according to an embodiment of the present disclosure.

In other embodiments, as shown in FIG. 8, the sub-pixel unit 20 may have a shape of an equilateral triangle, and the sub-pixel unit 20 includes three sub-pixels, i.e., the first sub-pixel 21a, the second sub-pixel 21b and the third sub-pixel 21c, which are evenly arranged, have a same shape and take a center of the sub-pixel unit 20 as a vertex point of the sub-pixels. It should be understood by those skilled in the art that the shapes of the sub-pixel unit and its sub-pixels includes but are not limited to above examples. For those skilled in the art, the shapes of the sub-pixel unit and its sub-pixels may be configured according to product requirements, and no limitations are made in the present disclosure.

In one embodiment, the organic light-emitting display panel also includes more than one scanning line and more than one data line. A pixel is formed by every m adjacent sub-pixels emitting different colors, m pixel circuits corresponding to m adjacent sub-pixels emitting different colors of the pixel are electrically connected to m adjacent data lines, and each of the pixel units corresponding to a respective one of the plurality of sub-pixels included in the pixels in a same row is electrically connected to the same scanning line. Since every m adjacent sub-pixels emitting different colors in the organic light-emitting display panel forms a pixel, the pixels may be formed in various color orders.

Figure 9:
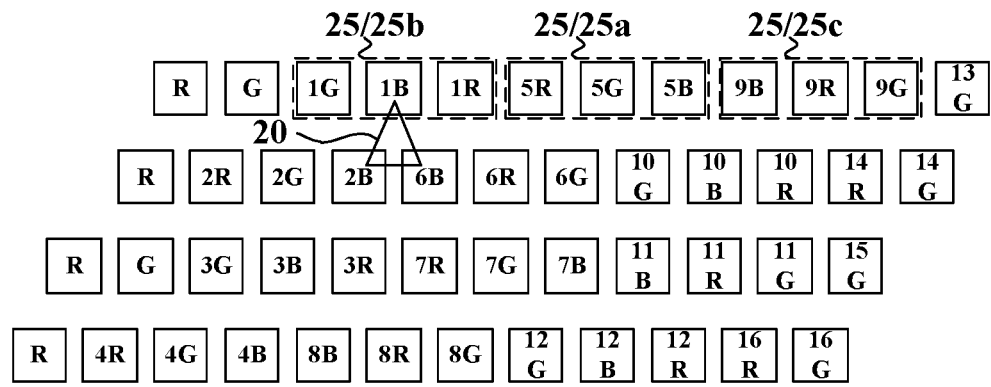
FIG. 9 is a diagram showing equivalent pixels of the organic light-emitting display panel shown in FIG. 1.
Figure 10:
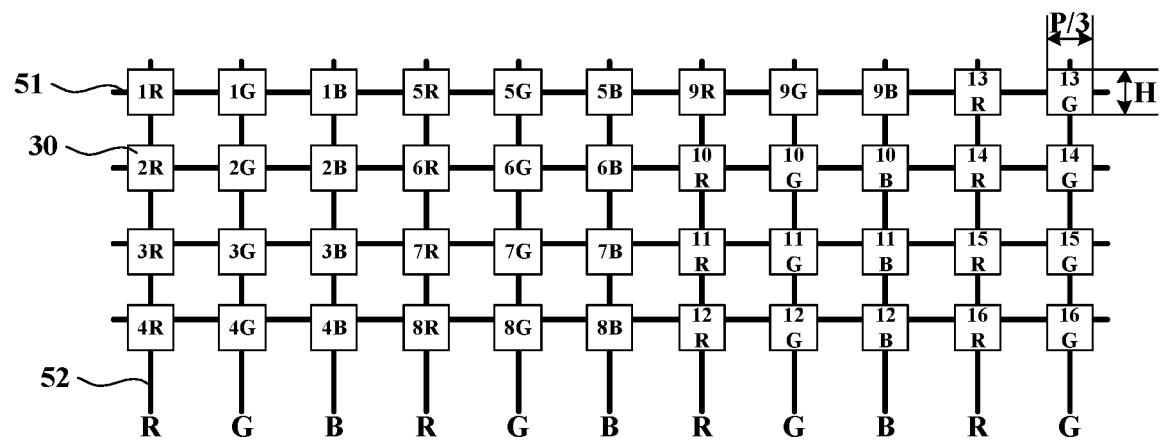
FIG. 10 is a diagram showing a pixel circuit array of the type of organic light-emitting display panels shown in FIG. 1.

Here, the organic light-emitting display panel shown in FIG. 1 is taken as an example to give a detailed description. FIG. 9 is a diagram showing equivalent pixels of the organic light-emitting display panel shown in FIG. 1, and FIG. 10 is a diagram showing the pixel circuit array of the organic light-emitting display panel shown in FIG. 1. The organic light-emitting display panel also includes more than one scanning line 51 and more than one data line 52. Every m adjacent sub-pixels 21 emitting different colors form a pixel 25. The m pixel circuits 30 corresponding to m adjacent sub-pixels 21 emitting different colors in the pixel 25 are electrically connected to m adjacent data lines 52, and each pixel circuit 30 corresponding to a respective one of the plurality of sub-pixels 21 included in the pixels 25 in a same row is electrically connected to the same scanning line 51. As shown in FIG. 9 and FIG. 10, one pixel 25 is formed by every m adjacent sub-pixels emitting different colors in the same row. Three sub-pixels 21 of the pixel 25 correspond to three adjacent data lines 52, and three sub-pixels 21 of each sub-pixel unit 20 are electrically connected to three pixel circuits 30 of four pixel circuits 30 formed by two columns and adjacent two rows.

As shown in FIG. 9, the organic light-emitting display panel includes a pixel 25a arranged in a RGB (red-green-blue) manner, a pixel 25b arranged in a GBR manner and a pixel 25c arranged in a BRG manner.

As shown in FIG. 10, the scanning lines 51 and the data lines 52 are arranged in a common manner of rows and columns. Pixel circuits 30 are disposed at the intersections between the scanning line 51 and the data line 52, and thus are arranged in a rectangular array. Each of the scanning lines 51 controls a row of pixel circuits 30, and the pixel circuits 30 in this row are electrically connected to a row of sub-pixels 21. All the sub-pixels 21 included in pixels arranged in the same row are disposed in a same row, and thus the pixel circuits 30 corresponding to the sub-pixels 21 of the pixels arranged in the same row are electrically connected to a same scanning line 51. When a pixel circuit 30 is electrically connected to the first electrode of the sub-pixel 21 corresponding to the pixel circuit 30 via the connecting wire, the connecting wire may be bended to avoid the unrelated via and unrelated first electrode, and then the connecting wire is electrically connected to the via and the first electrode corresponding to the pixel circuit 30. Therefore, the pixel circuits 30 arranged in a rectangular array can control the sub-pixels 21 arranged in a non-rectangular array.

FIG. 9 shows the arrangement and signs of the sub-pixels 21, and FIG. 10 shows the pixel circuits 30 and the signs of the sub-pixels 21 corresponding to the pixel circuits 30. Apparently, the pixel circuits 30 arranged in a rectangular array are electrically connected to and control the sub-pixels 21 arranged in a non-rectangular array. Here, the connecting wire (not shown) may be bended to electrically connect a pixel circuit 30 and its corresponding sub-pixel 21.

Figure 11:
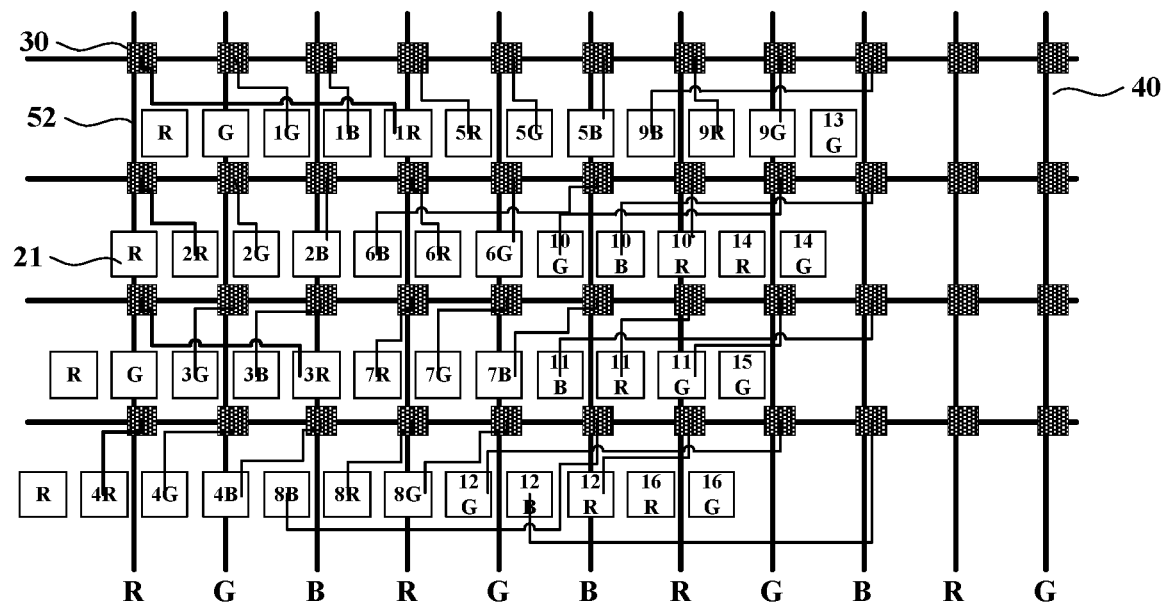
FIG. 11 is a diagram showing a couple of pixel circuit arrays and their connecting wires in the type of the organic light-emitting display panels shown in FIG. 1.
Figure 11:
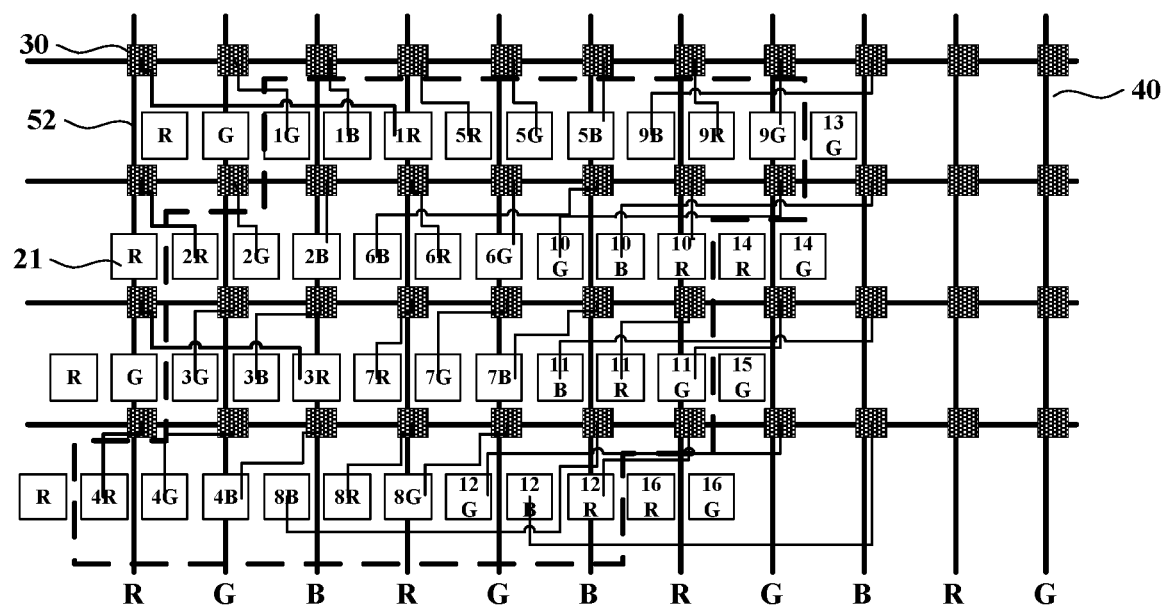

In order to give a clear description about the connecting method of the connecting wires, FIG. 11 gives a diagram showing connecting wires of the organic light-emitting display panel shown in FIG. 1. Since the data lines 52 shown in FIG. 11 are disposed in a color order of RGBRGB, the connecting wires 40 are bended to electrically connect the pixel circuits 30 to the corresponding sub-pixels 21.

Figure 12:
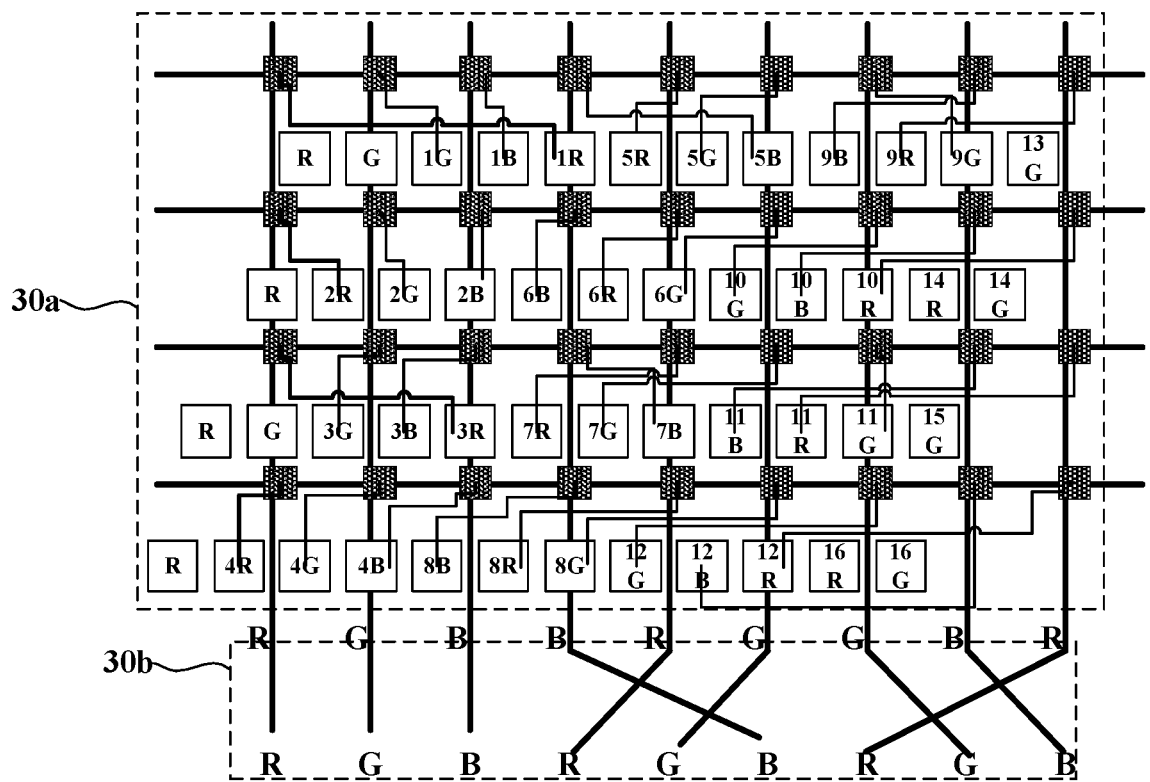
FIG. 12 is a diagram showing a pixel circuit array and its connecting wires of the type of the organic light-emitting display panel shown in FIG. 1.

FIG. 12 is a diagram showing another connecting wire of the organic light-emitting display panel shown in FIG. 1. The data lines 52 of the pixel circuit array shown in FIG. 12 are disposed in the color order corresponding to the relationship between the sub-pixels 21 and the corresponding pixel circuits 30 instead of the color order of RGBRGB, so as to facilitate the wire layout of the connecting wires 40. In one embodiment, the organic light-emitting display panel further includes data lines 52. The organic light-emitting display panel includes a pixel circuit array 30a formed by pixel circuits 30 and a step area 30b located on the periphery of the pixel circuit array 30a. The data lines 52 are disposed in parallel in the pixel circuit array 30a, and are interleaved and insulated from each other in the step area 30b.

In this embodiment, each of the data lines 52 is configured to transmit a data signal to a column of sub-pixels 21 emitting the same color, and m adjacent data lines 52 may be controlled to transmit data signals to m sub-pixels 21 emitting different colors. Therefore, m pixel circuits 30 corresponding to m sub-pixels 21 emitting different colors in the pixel 25 may be electrically connected to m adjacent data lines 52. Since each data line 52 is controlled to transmit data a signal to a column of sub-pixels 21 emitting the same color, the column of sub-pixels 21 emitting the same color may be located in the pixels 25 disposed in different columns or a same column. In one embodiment, as shown in FIG. 10, the pixel circuits 30 corresponding to the sub-pixels 21 of the pixels 25 disposed in the same column are electrically connected to the same data line 52.

In one embodiment, the organic light-emitting display panel shown in FIG. 1 is taken as an example. Referring to FIG. 9 to FIG. 12, three sub-pixels 21 of the sub-pixel unit 20 correspond to three pixel circuits 30 in the pixel circuit array formed by pixel circuits 30 in two columns and adjacent two rows.

In the organic light-emitting display panel, the sub-pixel unit 20 includes three sub-pixels 21 emitting the same color belonging to three pixels 25. Two of these pixels 25 are disposed in a same column and two are disposed in a same row. Two sub-pixels 21 of the sub-pixel unit 20 disposed in two pixels 25 arranged in a same column correspond to one data line 52, and the last sub-pixel 21 corresponds to another data line 52. The two data lines 52 may be adjacent with each other or not. Referring to FIG. 10, two data lines corresponding to the sub-pixel unit 20 are not adjacent to each other. Two sub-pixels 21 of the sub-pixel unit 20 disposed in two pixels 25 arranged in a same row correspond to one scanning line 51, and the last sub-pixel 21 corresponds to another scanning line 51. The two scanning lines 52 may be adjacent to each other.

In view of the above, one sub-pixel unit 20 corresponds to two data lines 52 and adjacent two scanning lines 51. A pixel circuit 30 is disposed at each of four intersections between the data lines 52 and the adjacent two scanning lines 51. That is, two data lines 52 and two adjacent scanning lines 51 correspond to a pixel circuit array formed by the pixel circuits 30 in two columns and adjacent two rows. Since each of the sub-pixels 21 correspond to a respective one of the pixel circuits 30, three sub-pixels 21 of the sub-pixel unit 20 correspond to three pixel circuits 30 of the pixel circuit array formed by the pixel circuits 30 in two columns and adjacent two rows.

Figure 13:
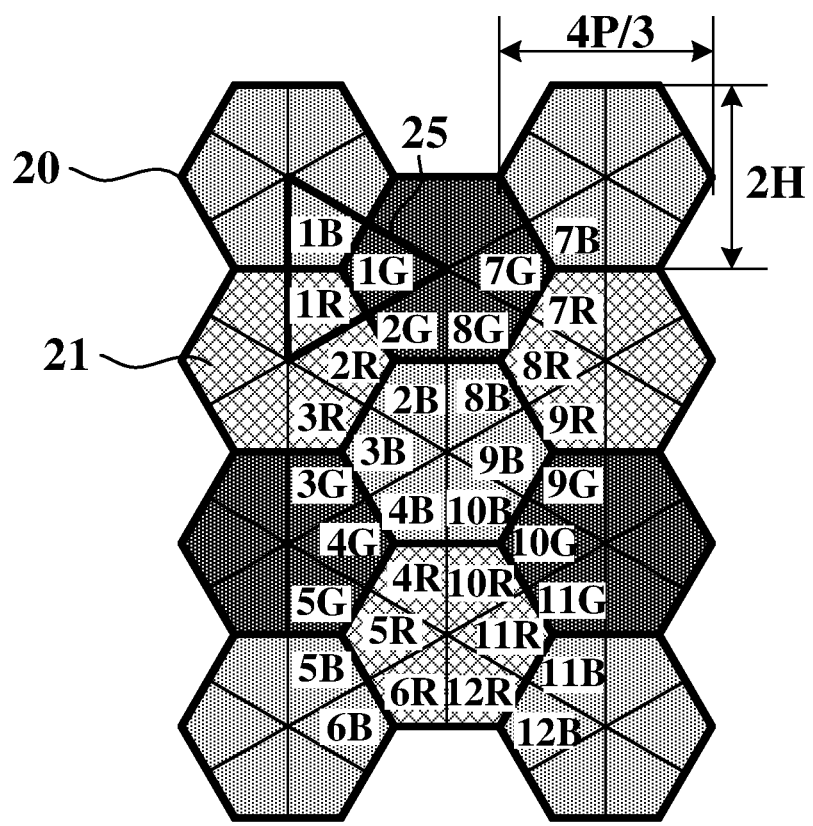
FIG. 13 is a diagram showing an organic light-emitting display panel according to an embodiment of the present disclosure.

In one embodiment, referring to the organic light-emitting display panel shown in FIG. 1 and FIG. 13, the organic light-emitting display panel further includes more than one scanning line 51 and more than one data line 52. The pixel circuit 30 has a height of H along the direction of the data line 52 has a length of P/3 along the direction of the scanning line 51. The sub-pixel unit 20 has a height of 2H along the direction of the data line 52 and a length of P of the base line of the sub-pixel unit 20 along the direction of the scanning line 51, where P is the distance between two nearby sides of two adjacent sub-pixel units 20 emitting the same color along scanning line direction.

The sub-pixel unit 20 has a height of 2H along the direction of the data line 52 and a length of P of the base line of the sub-pixel unit 20 along the direction of the scanning line 51, where P is the distance between two nearby sides of two adjacent sub-pixel units 20 emitting the same color along scanning line direction. Therefore, the area occupied by the sub-pixel unit 20 is S1=P*2H*1/2=PH. The pixel circuit 30 has a height of H along the direction of the data line 52 has a length of P/3 along the direction of the scanning line 51. Therefore, the area occupied by the pixel circuit 30 is S2=P/3*H=PH/3. Apparently, S2=S1/3. That is, the area S2 of the pixel circuit 30 is one third of the area S1 of the sub-pixel unit 20. Three sub-pixels 21 of one sub-pixel unit 20 correspond to three pixel circuits 30; i.e., one sub-pixel unit 20 corresponds to three pixel circuits 30. Since the area of one sub-pixel unit 20 is approximately the same as the area of three pixel circuits 30, the total area of the pixel circuit array of the organic light-emitting display panel is approximate the same as the total area of the sub-pixel unit, and a wide frame of the organic light-emitting display panel caused by the excessively large value of the total area of the pixel circuit array is avoided.

In one embodiment, FIG. 13 is a diagram showing an organic light-emitting display panel according to an embodiment of the present disclosure. The organic light-emitting display panel shown in FIG. 13 differs from any one of the organic light-emitting display panel in above embodiments in that, the sub-pixel unit 20 has a shape of a hexagon. The sub-pixel unit includes six sub-pixels, i.e., a first sub-pixel, a second sub-pixel, a third sub-pixel, a forth sub-pixel, a fifth sub-pixel and a sixth sub-pixel, which are evenly arranged and take a center of the sub-pixel unit 20 as the vertex point. Therefore, the sub-pixel units 20 of the organic light-emitting display panel are arranged in a high-density manner with a small gap, so that more sub-pixel units may be disposed and a high resolution is achieved. The first electrodes of six sub-pixels 21 in each sub-pixel unit 20 are disposed with insulation according to FIG. 13. Then, an organic light-emitting layer is formed in the sub-pixel unit 20 by evaporating or ink-jet printing, which may form the six sub-pixels 21 shown in FIG. 13. Two adjacent first electrodes of the sub-pixel unit 20 are separated from each other by means of an organic bank or a support pillar (e.g. PS pillar). The shape of the sub-pixel 21 relates to the shape of the corresponding first electrode, and the sub-pixel 21 shown in FIG. 13 has a shape of a rhombus. In other embodiments, the sub-pixel may have a shape of a rectangle or a triangle.

In one embodiment, the organic light-emitting display panel also includes more than one scanning line and more than one data line. Every m adjacent sub-pixels emitting different colors form a pixel, m pixel circuits correspond to m adjacent sub-pixels emitting different colors in the pixel are electrically connected to m adjacent data lines, and each pixel unit corresponds to a respective one of the plurality of sub-pixels included in the pixels in a same row is electrically connected to a same scanning line. Since a pixel is formed by every m adjacent sub-pixels emitting different colors in the organic light-emitting display panel, the pixels can by formed in various color orders.

Figure 14:
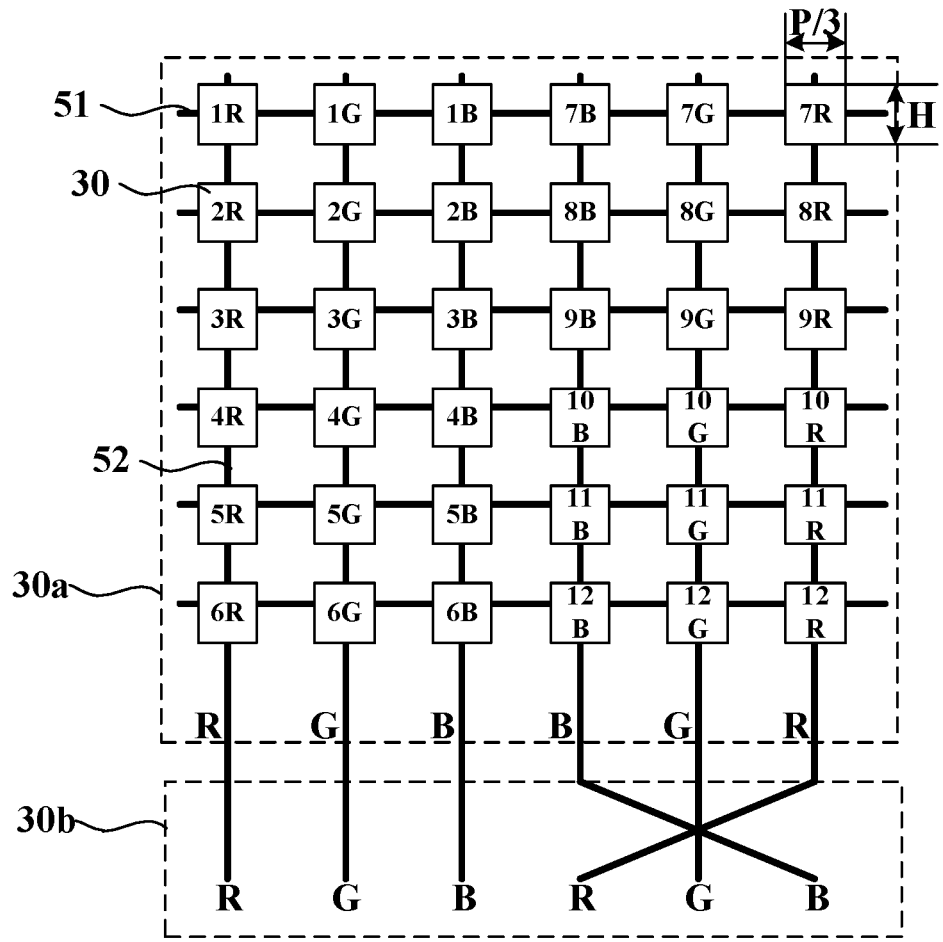
FIG. 14 is a diagram showing a pixel circuit array of the type of organic light-emitting display panel shown in FIG. 13.

Here, the organic light-emitting display panel shown in FIG. 13 is taken as an example to give a detailed description. FIG. 14 is a diagram showing the pixel circuit array of the organic light-emitting display panel shown in FIG. 13. The organic light-emitting display panel includes more than one scanning line 51 and more than one data line 52. Every m adjacent sub-pixels 21 emitting different colors form a pixel 25, m pixel circuits 30 correspond to m adjacent sub-pixels 21 emitting different colors in the pixel 25 are electrically connected to m adjacent data lines 52, and each pixel circuit 30 corresponding to a respective one of the plurality of sub-pixels 21 included in the pixels in a same row is electrically connected to the same scanning line 51. FIG. 13 shows the arrangement and signs of the sub-pixels 21, and FIG. 14 shows the pixel circuits 30 and the signs of the sub-pixels 21 corresponding to the pixel circuits 30. Apparently, the pixel circuits 30 arranged in a rectangular array are electrically connected to and control the sub-pixels 21 arranged in a non-rectangular array. Here, the connecting wires (not shown) may be bended to electrically connect the pixel circuits 30 to the corresponding sub-pixels 21.

As shown in FIG. 13 and FIG. 14, a pixel 25 is a triangle formed by connecting the centers of every three adjacent sub-pixel units 20 emitting different colors arranged in a triangle manner, and the pixel 25 includes three sub-pixels 21 emitting different colors. The three sub-pixels 21 of the pixel 25 correspond to three adjacent data lines 52 and one scanning line 51.

As shown in FIG. 13 and FIG. 14, six sub-pixels 21 of each sub-pixel unit 20 are disposed in six pixels 25, and every two pixels 25 of the six pixels 25 are disposed in a same row. Therefore, one sub-pixel unit 20 corresponds to three adjacent scanning lines 51. In one embodiment, the pixel circuits 30 corresponding to the sub-pixels 21 of the pixels 25 disposed in a same column are electrically connected to a same data line 52. Accordingly, six sub-pixels 21 of each sub-pixel unit 20 are disposed in six pixels 25, and every three pixels 25 of the six pixels 25 are disposed in a same column. Therefore, one sub-pixel unit 20 corresponds to two data lines 52. The pixel circuits 30 are disposed at the intersections between three adjacent scanning lines 51 and two data lines 52. That is, a pixel circuit array is formed by pixel circuits 30 in three adjacent rows and two columns. In one embodiment, six sub-pixels 21 of the sub-pixel unit 20 correspond to six pixel circuits 30 of the pixel circuit array formed by the pixel circuits 30 in two columns and adjacent three rows.

In one embodiment, the organic light-emitting display panel further includes data lines. The organic light-emitting display panel includes a pixel circuit array formed by pixel circuits and a step area located on the periphery of the pixel circuit array. The data lines are disposed in parallel in the pixel circuit array, and the data lines are interleaved and insulated from each other in the step area. Referring to FIG. 14, the organic light-emitting display panel further includes data lines 52. The organic light-emitting display panel includes a pixel circuit array 30a formed by pixel circuits 30 and a step area 30b located on the periphery of the pixel circuit array 30a. The plurality of data lines 52 are disposed in parallel in the pixel circuit array 30a, and the plurality of data lines are interleaved and insulated from each other in the step area 30b. In the pixel circuit array 30a of the organic light-emitting display panel, the data lines 52 are not disposed in a color order of RGBRGB. However, data lines of a conventional organic light-emitting display panel are disposed in a color order RGBRGB. In order to be compatible with the conventional organic light-emitting display panel, in this embodiment the data lines 52 disposed in a color order of RGBRGB are interleaved and insulated from each other in the step area 30b, and said data lines 52 are electrically connected to the data lines 52 corresponding to the pixel circuit array 30a.

In one embodiment, referring to the organic light-emitting display panel shown in FIG. 13 and FIG. 14, the organic light-emitting display panel further includes: more than one scanning lines 51 and more than one data lines 52. The pixel circuit 30 has a height of H along the direction of the data line 52 and a length of P/3 along the direction of the scanning line 51. The sub-pixel unit 20 has a height of 2H along the direction of the data line 52 and a length of 4P/3 along the direction of the scanning line 51, where P is the distance between two nearby sides of two adjacent sub-pixel units 20 emitting the same color along scanning line direction.

The sub-pixel unit 20 has a height of 2H along the direction of the data line 52 and a length of 4P/3 along the direction of the scanning line 51, where P is the distance between two nearby sides of two adjacent sub-pixel units 20 emitting the same color along scanning line direction. The area occupied by the sub-pixel unit 20 is $S1=(4P/3/2)*(2H/2)*1/2*6=2PH$. The pixel circuit 30 has a height of H along the direction of the data line 52 and a length of P/3 along the direction of the scanning line 51. Thus, the area occupied by the pixel circuit 30 is $S2=P/3*H=PH/3$. Apparently, $S2=S1/6$. That is, the area S2 of the pixel circuit 30 is one sixth of the area S1 of the sub-pixel unit 20. Six sub-pixels 21 of one sub-pixel unit 20 correspond to six pixel circuits 30; i.e., one sub-pixel unit 20 corresponds to six pixel circuits 30. Since the area of one sub-pixel unit 20 is approximately equal to the area of six pixel circuits 30, the total area of the pixel circuit array of the organic light-emitting display panel is approximate equal to the total area of the sub-pixel unit, and a wide frame of the organic light-emitting display panel caused by the excessively large value of the total area of the pixel circuit array is avoided.

Figure 15:
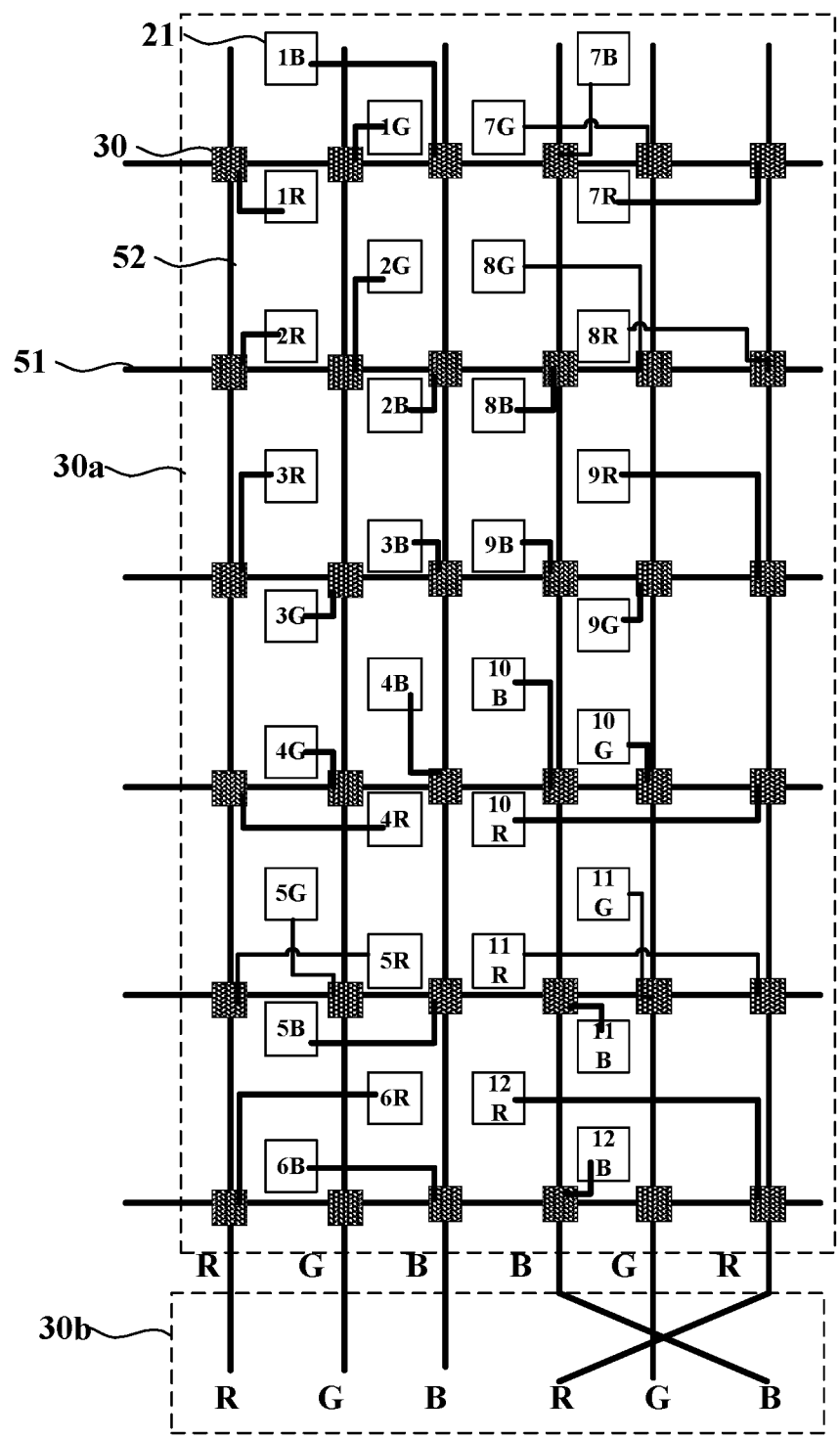
FIG. 15 is a diagram showing the pixel circuit array and its connecting wires of the type of organic light-emitting display panel shown in FIG. 13.

In order to give a clear description about the connecting method of the connecting wires, FIG. 15 is a diagram showing connecting wires of the organic light-emitting display panel shown in FIG. 13. As shown in FIG. 15, the data lines 52 are disposed in the step area 30b according to a color order of RGBRGB. The data lines 52 are disposed in the color order according to the relationship between the sub-pixels 21 and the corresponding pixel circuits 30 instead of the color order of RGBRGB, so as to facilitate the wire layout of the connecting wires 40. In one embodiment, the organic light-emitting display panel further includes data lines 52. The organic light-emitting display panel includes a pixel circuit array 30a formed by pixel circuits 30 and a step area 30b located on the periphery of the pixel circuit array 30a. The data lines 52 are disposed in parallel in the pixel circuit array 30a, and are interleaved and insulated from each other in the step area 30b.

Figure 16:
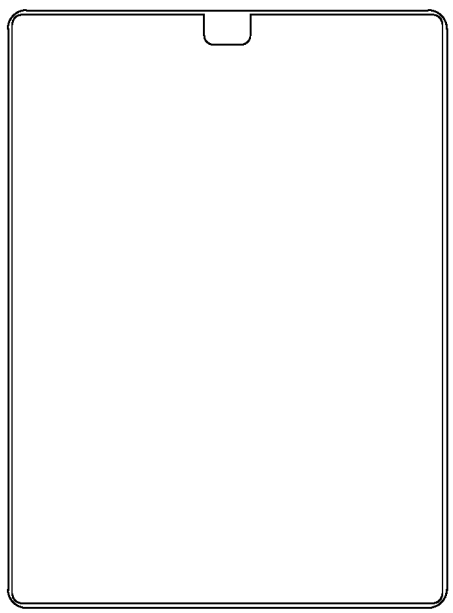
FIG. 16 is a diagram showing a display panel according to an embodiment of the present disclosure.

As shown in FIG. 16, the present disclosure further provides an electronic device, and the electronic device includes the organic light-emitting display panels provided in any of above embodiments. Each of the sub-pixel units of the organic light-emitting display panel includes more than one sub-pixel, and each sub-pixel corresponds to a pixel circuit. Therefore, a high resolution may be achieved in the organic light-emitting display panel. In one embodiment, the electronic device may be a smart phone.

The sub-pixels of the organic light-emitting display panel are arranged in a non-rectangular array, and the pixel circuits are arranged in a rectangular array. A pixel circuit is electrically connected to the first electrode of the sub-pixel corresponding to the pixel circuit. Therefore, the pixel circuits arranged in a rectangular array can control the sub-pixels arranged in a non-rectangular array. In one embodiment, the thin-film transistors of the pixel circuits of the organic light-emitting display panel are formed by ink-jet printing. Since the pixel circuits are arranged in a rectangular array, the thin-film transistors of the pixel circuits may be disposed periodically in a rectangular array.

The resolution of the organic light-emitting display panel has been improved without increasing the technology difficulty. The organic light-emitting display panel further provides the pixel circuit array which controls the resolution of the sub-pixel unit array. Since the scanning lines and the data lines corresponding to the pixel circuit array are arranged in a common manner of rows and columns, the complexity of wire layout is decreased.

When the data lines of the pixel circuit array are periodically disposed with a non-RGB manner, the data lines in the step area of the organic light-emitting display panel may also be periodically disposed with the RGB manner. As long as the data lines periodically disposed in step area with the RGB manner are interleaved and insulated from each other in a specific manner, the data lines periodically disposed with the RGB manner in the step area of the organic light-emitting display panel can be correctly electrically connected to the data lines periodically disposed with the non-RGB manner of the pixel circuit array. Vias may be provided to achieve the electrical connection between the data lines in the step area and the data lines of the pixel circuit array.

In the organic light-emitting display panel, a film layer, in which the connecting wire is located, is in a same layer with the first electrode of the sub-pixel; or the film layer, in which the connecting wire is located, is in a same layer with the source electrode and the drain electrode of the light-emitting control transistor of the pixel circuit. The connecting wire may be bended to avoid the unrelated via and the first electrode, and the connecting wire may be electrically connected to the via and the first electrode corresponding to the pixel circuit. The wire layout of the connecting wires may be applied to the top-emitting organic light-emitting display panel having a complex compensation circuit. In one embodiment, the wire layout of the connecting wires may also be applied to the bottom-emitting organic light-emitting display panel.

In the organic light-emitting display panel, an extra wiring layer may be provided and etched to form the connecting wire. Therefore, the film layer in which the connecting wire is located is disposed between the film layer in which the first electrode of the sub-pixel is located and the film layer in which the source electrode and the drain electrode of the light-emitting control transistor of the pixel circuit are located. The connecting wire may be bended to avoid the unrelated via and first electrode, and the connecting wire may be electrically connected to the via and the first electrode corresponding to the pixel circuit. The wire layout of the connecting wire may be applied to the top-emitting organic light-emitting display panel with a specific aperture ratio. In one embodiment, the wire layout of the connecting wire may also be applied to the bottom-emitting organic light-emitting display panel.

It should be noted that the above contents are only preferred embodiments of the present disclosure and its technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. An organic light-emitting display panel, comprising:
   a plurality of sub-pixel units, defined by a bank, wherein the plurality of sub-pixel units emits m different colors, any two adjacent sub-pixel units of the plurality of sub-pixel units emit different colors, each of the plurality of sub-pixel units comprises n sub-pixels emitting a same color, each of the n sub-pixels comprises a first electrode, first electrodes of any two of the n sub-pixels are separated from each other, wherein m is 3 or 4, and n is an integer no less than 3; and
   a plurality of pixel circuits, arranged in a rectangular array, wherein the plurality of pixel circuits is in one-to-one correspondence with then sub-pixels of the plurality of sub-pixel units, and wherein each pixel circuit of the plurality of pixel circuits is electrically connected to the first electrode of the corresponding sub-pixel via a connecting wire;
   wherein the plurality of sub-pixel units each has a shape of a triangle and comprises three sub-pixels, wherein the plurality of sub-pixel units each has a shape of a triangle and comprises three sub-pixels
   wherein the organic light-emitting display panel further comprises a plurality of scanning lines and a plurality of data lines, wherein the plurality of pixel circuits each has a height of H along a direction of the plurality of data lines and a length of P/3 along a direction of the plurality of scanning lines, wherein the plurality of sub-pixel units each has a height of 2H along the direction of the plurality of data lines and a length of P of a base line of the each sub-pixel unit along the direction of the plurality of scanning lines, where P is a distance between two nearby sides of two adjacent sub-pixel units emitting a same color of the plurality of sub-pixel units along scanning line direction.

2. The organic light-emitting display panel according to claim 1, wherein the plurality of pixel circuits each comprises a light-emitting control transistor, wherein the light-emitting control transistor comprises a source electrode, a drain electrode and a gate electrode, wherein the drain electrode is electrically connected to said first electrode via the connecting wire.

3. The organic light-emitting display panel according to claim 2, wherein a film layer in which the connecting wire is located is disposed between a film layer the first electrode is located and a film layer the drain electrode is located.

4. The organic light-emitting display panel according to claim 1, wherein the connecting wire and the first electrode are disposed in a same layer.

5. The organic light-emitting display panel according to claim 1, wherein a projection of the connecting wire in a direction perpendicular to the organic light-emitting display panel does not overlap with a first electrode not corresponding to the connecting wire.

6. The organic light-emitting display panel according to claim 1, further comprising: a plurality of scanning lines and a plurality of data lines,
   wherein a pixel is formed by every m adjacent sub-pixels of the sub-pixels emitting different colors, m pixel circuits of the plurality of pixel circuits corresponding to the m adjacent sub-pixels of the sub-pixels emitting different colors of the pixel are electrically connected to m adjacent data lines of the plurality of data lines, and a plurality of pixel circuits corresponding to all the sub-pixels of a plurality of pixels in a same row are electrically connected to one of the plurality of scanning lines.

7. The organic light-emitting display panel according to claim 6, the plurality of pixel circuits corresponding to all the sub-pixels emitting a same color in a same column are electrically connected to one of the plurality of data lines.

8. The organic light-emitting display panel according to claim 1, further comprising: a plurality of data lines, arranged in parallel in the rectangular array of the plurality of pixel circuits, and intersecting and insulated from each other in a step area on a periphery of the plurality of pixel circuits.

9. The organic light-emitting display panel according to claim 1, wherein the plurality of sub-pixel units each has a shape of an isosceles triangle and is divided into a first sub-pixel, a second sub-pixel and a third sub-pixel according to a letter "T".

10. The organic light-emitting display panel according to claim 9, wherein the first sub-pixel has a shape of an isosceles triangle containing a vertex angle of the isosceles triangle of the each sub-pixel unit, wherein the second sub-pixel and the third sub-pixel either have a same shape of a right-angled trapezoid containing a base angle of the isosceles triangle of the each sub-pixel unit, or have the shape of said rectangle as the first sub-pixel.

11. The organic light-emitting display panel according to claim 1, wherein the plurality of sub-pixel units each has a shape of an equilateral triangle and comprises a first sub-pixel, a second sub-pixel and a third sub-pixel, evenly arranged and each has a same shape and takes a center of said sub-pixel unit as a vertex point.

12. The organic light-emitting display panel according to claim 1, wherein the first, second and third sub-pixels of said sub-pixel unit correspond to three pixel circuits of the plurality of pixel circuits formed between pixel circuits in two columns and two adjacent rows.

13. An organic light-emitting display panel, comprising:
a plurality of sub-pixel units, defined by a bank, wherein the plurality of sub-pixel units emits m different colors, any two adjacent sub-pixel units of the plurality of sub-pixel units emit different colors, each of the plurality of sub-pixel units comprises n sub-pixels emitting a same color, each of the n sub-pixels comprises a first electrode, first electrodes of any two of the n sub-pixels are separated from each other, wherein m is 3 or 4, and n is an integer no less than 3; and
a plurality of pixel circuits, arranged in a rectangular array, wherein the plurality of pixel circuits is in one-to-one correspondence with then sub-pixels of the plurality of sub-pixel units, and wherein each pixel circuit of the plurality of pixel circuits is electrically connected to the first electrode of the corresponding sub-pixel via a connecting wire;
wherein the plurality of sub-pixel units each has a shape of a hexagon and comprises evenly arranged six sub-pixels sharing a center of said sub-pixel unit as a vertex point; and
wherein the organic light-emitting display panel further comprises a plurality of scanning lines and a plurality of data lines, wherein the plurality of pixel circuits each has a height of H along a direction of the plurality of data lines and a length of P/3 along a direction of the plurality of scanning lines, wherein the plurality of sub-pixel units each has a height of 2H along the direction of the plurality of data lines and a length of 4P/3 along the direction of the plurality of scanning lines, where P is a distance between two nearby sides of two adjacent sub-pixel units emitting a same color of the plurality of sub-pixel units along scanning line direction.

14. The organic light-emitting display panel according to claim 13, wherein the six sub-pixels correspond to six of the plurality of pixel circuits formed in two columns and three adjacent rows.

15. An electronic device, comprising an organic light-emitting display panel, wherein the organic light-emitting display panel comprises:
a plurality of sub-pixel units, which are defined by a bank, wherein the plurality of sub-pixel units have m different colors, any two adjacent sub-pixel units of the plurality of sub-pixel units have different colors, each of the plurality of sub-pixel units comprises n sub-pixels of a same color, each of the sub-pixels comprises a first electrode, first electrodes of any two of the sub-pixels are separated from each other, wherein m is 3 or 4, and n is a integer no less than 3; and
a plurality of pixel circuits, which are arranged in a rectangular array, wherein the plurality of pixel circuits are in one-to-one correspondence with the sub-pixels, and each pixel circuit of the plurality of pixel circuits is electrically connected to the first electrode corresponding to the each pixel circuit via a connecting wire;
wherein the plurality of sub-pixel units each has a shape of a triangle and comprises three sub-pixels, wherein the plurality of sub-pixel units each has a shape of a triangle and comprises three sub-pixels; and
wherein the organic light-emitting display panel further comprises a plurality of scanning lines and a plurality of data lines, wherein the plurality of pixel circuits each has a height of H along a direction of the plurality of data lines and a length of P/3 along a direction of the plurality of scanning lines, wherein the plurality of sub-pixel units each has a height of 2H along the direction of the plurality of data lines and a length of P of a base line of the each sub-pixel unit along the direction of the plurality of scanning lines, where P is a distance between two nearby sides of two adjacent sub-pixel units emitting a same color of the plurality of sub-pixel units along scanning line direction.

16. The electronic device according to claim 15, wherein the plurality of pixel circuits each comprises a light-emitting control transistor, the light-emitting control transistor comprises a source electrode, a drain electrode and a gate electrode, wherein the drain electrode is electrically connected to said first electrode via the connecting wire.

17. The electronic device according to claim 16, wherein a film layer the connecting wire is located is disposed between a film layer the first electrode is located and a film layer the drain electrode is located.

* * * * *